United States Patent
Talukder et al.

(10) Patent No.: US 11,907,104 B1
(45) Date of Patent: *Feb. 20, 2024

(54) SERVICE VIRTUALIZATION (71) Applicant: Wells Fargo Bank, N.A., San Francisco, CA (US)

(72) Inventors: Saraf Uddin Talukder, New Hyde Park, NY (US); Jalil Vaidya, Little Falls, NJ (US)

(73) Assignee: Wells Fargo Bank, N.A., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/804,418

(22) Filed: May 27, 2022

Related U.S. Application Data (63) Continuation of application No. 17/145,785, filed on Jan. 11, 2021, now Pat. No. 11,372,747.

(51) Int. Cl.
*G06F 21/57* (2013.01)
*G06F 11/36* (2006.01)
(Continued)

(52) U.S. Cl.
CPC ...... *G06F 11/3664* (2013.01); *G06F 9/45508* (2013.01); *G06F 9/547* (2013.01);
(Continued)

(58) Field of Classification Search
CPC ............. G06F 11/3664; G06F 11/3688; G06F 11/3414; G06F 11/3672; G06F 11/3684;
(Continued)

(56) References Cited

U.S. PATENT DOCUMENTS 8,898,643 B2  11/2014  Rode
9,043,440 B2  5/2015  Leiba et al.
(Continued)

OTHER PUBLICATIONS

Vlas Zyrianov et al., Automated Recording and Semantics-Aware Replaying of High-Speed Eye Tracking and Interaction Data to Support Cognitive, 2020, [Retrieved on Aug. 4, 2023]. Retrieved from the internet: <URL: https://ieeexplore.ieee.org/stamp/stamp.jsp?tp=&arnumber=9240624> 12 Pages (464-475) (Year: 2020).*

(Continued)

*Primary Examiner* — Anibal Rivera
(74) *Attorney, Agent, or Firm* — Merchant & Gould P.C.

(57) ABSTRACT

An application in production may communicate with one or more heterogeneous services, including requesting and receiving data from a one or more data sources. The communication between the application and the services can include complicated scenarios making facilitating end-to-end testing of the application difficult. The disclosed service virtualization solution works in two stages of 'record and replay' to simulate a backend service. During the recording stage, the disclosed tool intercepts the data flow between the client and the service and records the data and during the replay stage, the disclosed tool creates a proxy service that simulates the responses of service application by reading the recorded session file, allowing for the client application to be tested without having to connect to the actual service application.

16 Claims, 10 Drawing Sheets

(51) Int. Cl.
*H04L 43/00* (2022.01)
*G06F 9/54* (2006.01)
*G06F 9/455* (2018.01)
*H04L 43/04* (2022.01)
*H04L 43/50* (2022.01)
*H04L 67/75* (2022.01)
*H04L 43/0805* (2022.01)
*G06F 11/34* (2006.01)

(52) U.S. Cl.
CPC .......... *G06F 11/3688* (2013.01); *H04L 43/04* (2013.01); *H04L 43/14* (2013.01); *H04L 43/50* (2013.01); *H04L 67/75* (2022.05); *G06F 11/3414* (2013.01); *G06F 11/3672* (2013.01); *G06F 11/3684* (2013.01); *H04L 43/0805* (2013.01)

(58) Field of Classification Search
CPC ..... G06F 9/45508; G06F 9/547; H04L 67/75; H04L 43/04; H04L 43/14; H04L 43/50; H04L 43/0805
See application file for complete search history.

(56) References Cited

U.S. PATENT DOCUMENTS

| | | | |
|---|---|---|---|
| 10,031,836 B2 | 7/2018 | Versteeg et al. | |
| 10,282,282 B2 | 5/2019 | Shavro et al. | |
| 10,459,753 B2 | 10/2019 | Raskar | |
| 10,474,563 B1 | 11/2019 | Rai et al. | |
| 10,565,086 B2 | 2/2020 | Michelsen | |
| 10,671,515 B1 | 6/2020 | Sanghvi | |
| 10,678,676 B2 | 6/2020 | Schmalz, Jr. | |
| 2005/0160095 A1 | 7/2005 | Dick et al. | |
| 2007/0106810 A1 | 5/2007 | Ryman | |
| 2009/0132335 A1* | 5/2009 | Pein | G06Q 30/0202 705/7.29 |
| 2014/0132571 A1* | 5/2014 | Zeng | G06F 11/3688 345/178 |
| 2017/0039041 A1 | 2/2017 | Bommireddi | |
| 2019/0095317 A1* | 3/2019 | Palanisamy | G06F 11/0706 |
| 2019/0116111 A1 | 4/2019 | Izard et al. | |
| 2020/0050537 A1 | 2/2020 | Schmalz, Jr. | |
| 2020/0104511 A1* | 4/2020 | Stolfo | H04L 67/131 |
| 2020/0133827 A1 | 4/2020 | Tkac et al. | |
| 2020/0136933 A1 | 4/2020 | Raskar | |
| 2021/0311850 A1 | 10/2021 | Park et al. | |

OTHER PUBLICATIONS

Dinesh Subhraveti et al., Record and transplay: partial checkpointing for replay debugging across heterogeneous systems, Jun. 7-11, 2011, [Retrieved on Aug. 4, 2023]. Retrieved from the internet: <URL: https://dl.acm.org/doi/pdf/10.1145/1993744.1993757> 12 Pages (109-120) (Year: 2011).*

Versteeg et al.; "Enhanced Playback of Automated Service Emulation Models Using Entropy Analysis," 2016 IEEE/ACM International Workshop on Continuous Software Evolution and Delivery (CSED), Date of Publication: Jan. 2017.

Yong Pan et al., Research on Dependability of Cloud Computing Systems, 2014 IEEE, [Retrieved on Apr. 12, 2022]. Retrieved from the internet: <URL: https://ieeexplore.ieee.org/stamp/stamp.jsp?tp=&arnumber=7107234> 5 Pages (435-439) (Year: 2014).

* cited by examiner

SERVICE VIRTUALIZATION

BACKGROUND

Service virtualization is the process of simulating interactions with various endpoints of an application to facilitate end-to-end testing in a computing environment. Virtual services can be used instead of real time services, enabling frequent and comprehensive testing even when the relevant distributed endpoints are missing in the test environment. By simulating the behavior of relevant endpoints that will be present in a final production environment, service virtualization allows distributed applications to undergo more robust integration testing.

SUMMARY

Embodiments of the disclosure are directed to creating and executing testing scenarios for a client application.

In a first embodiment, a method for conducting a testing scenario is disclosed. The method comprises: intercepting data transmissions between a client application and a service application, wherein each of the data transmissions includes one or more data packets; recording the one or more data packets associated with each of the data transmissions without decrypting the one or more data packets; storing time interval data associated with each of the one or more data packets, the time interval data defining an amount of time between each subsequent data packet; and storing origin data associated with each of the one or more data packets, the origin data defining whether each of the one or more data packets originated from the client application or from the service application.

In another embodiment, a system for conducting a testing scenario is disclosed. The system comprises: a processing unit; and system memory, the system memory including instructions which, when executed by the processing unit, cause the system to: intercept data transmissions between a client application and a service application, wherein each of the data transmissions includes one or more data packets; record the one or more data packets associated with each of the data transmissions without decrypting the one or more data packets; store time interval data associated with each of the one or more data packets, the time interval data defining an amount of time between each subsequent data packet; and store origin data associated with each of the one or more data packets, the origin data defining whether each of the one or more data packets originated from the client application or from the service application.

In yet another embodiment, a non-transitory computer-readable medium is disclosed for storing instructions for a testing application that, when executed by at least one central processing unit, cause the at least one central processing unit to: generate a user interfacing one or more options to manage a testing of a client application; responsive to receiving an input on the user interface to create a test scenario, intercept data transmissions between the client application and a service application, wherein each of the data transmissions includes one or more data packets; record the one or more data packets associated with each of the data transmissions without decrypting the one or more data packets; store time interval data associated with each of the one or more data packets, the time interval data defining an amount of time between each subsequent data packet; store origin data associated with each of the one or more data packets, the origin data defining whether each of the one or more data packets originated from the client application or from the service application; and allow each of the data transmissions to continue with the transmission from the client application to the service application or from the service application to the client application; and responsive to receiving an input on the user interface to test the client application, replay the data transmissions as recorded; and mimic the service application during replay by timing transmission of the one or more data packets for each of the data transmissions according to the time interval data associated with each of the one or more data packets.

The details of one or more techniques are set forth in the accompanying drawings and the description below. Other features, objects, and advantages of these techniques will be apparent from the description, drawings, and claims.

DESCRIPTION OF THE DRAWINGS

The following drawings are illustrative of particular embodiments of the present disclosure and therefore do not limit the scope of the present disclosure. The drawings are not to scale and are intended for use in conjunction with the explanations in the following detailed description. Embodiments of the present disclosure will hereinafter be described in conjunction with the appended drawings, wherein like numerals denote like elements.

DETAILED DESCRIPTION

The present disclosure relates to service virtualization that is configured to replicate interactions with one or more real time services.

An application in production may communicate with one or more heterogeneous services, including requesting and receiving data from a one or more data sources. The communication between the application and the services can include complicated scenarios. For example, in some cases, factors that may impact the testing results may include time of day, the data itself, the time between when the data is sent to and received from the service, etc. Such intricate and complicated scenarios are difficult to simulate and manage when performing end-to-end testing of the application during development, testing, and/or deployment.

In addition to replicating complex scenarios, the use of service virtualization to facilitate end-to-end testing includes other advantages. For example, a service virtualization solution can be used to continue testing when the service itself is unavailable, replicate complex scenarios, reduce the cost and dependency on third party applications, and/or enable and enhance continuous testing and automated testing.

Example embodiments of service virtualization disclosed herein can be implemented in two stages of 'record' and 'replay' to simulate a backend service. During the recording stage, the disclosed service virtualization works like a recorder by intercepting the data flow between the client and the service and records data as a flat file which includes the direction of data flow, length of message bytes, time since last message, actual message bytes, etc. During the replay stage, the disclosed service virtualization creates a proxy to which the client connects. In turn the tool uses the session data file to simulate the response from the service by reading the recorded session file.

In some examples, the disclosed service virtualization tool may be configured for communications between a client and a service using the Transmission Control Protocol (TCP). In other examples, the disclosed service virtualization tool may also be configured for communications between a client a service using other protocols and communication formats such as Hypertext Transfer Protocol (HTTP), Messaging and Queuing (MQ) protocols such as Solace Messaging and Queuing, IBM Messaging and Queuing, Microsoft Messaging and Queuing, Representational State Transfer (REST), Oracle Coherence In-Memory Object store and any other relevant protocols.

Currently available service virtualization tools on the market have limitations. In one example, when the target service is on a TCP connection, existing virtualization tools achieve virtualization by analyzing the request data packets and saving the matching responses. However, this may not always be possible for dependencies related to third party API's that restrict knowledge of the encoding used.

In some examples, the disclosed service virtualization tool matches requests and responses using time-based data sequences and adding client markers to expected client requests. This also allows for the disclosed service virtualization tool to be protocol and data agnostic because the disclosed system does not decrypt any of the data packets sent between the client and the service. Instead, the disclosed system records the packets, the timing of the packets (e.g., durations between), and marks the origin of the packets. During replay, the packets are sequenced according to the time stamps and markers.

In another example, existing service virtualization tools can send data only as a response to a request. However, there are cases where data can flow from the target service without any request propagating from the clients. For example, a market data service may send continuous stream of data to clients without any one single request for it. The disclosed service virtualization tool supports generation of a response without requiring a previous request by allowing the relevant party to send an out-of-band request to the service virtualization tool that the party is ready to receive data.

Figure 1:
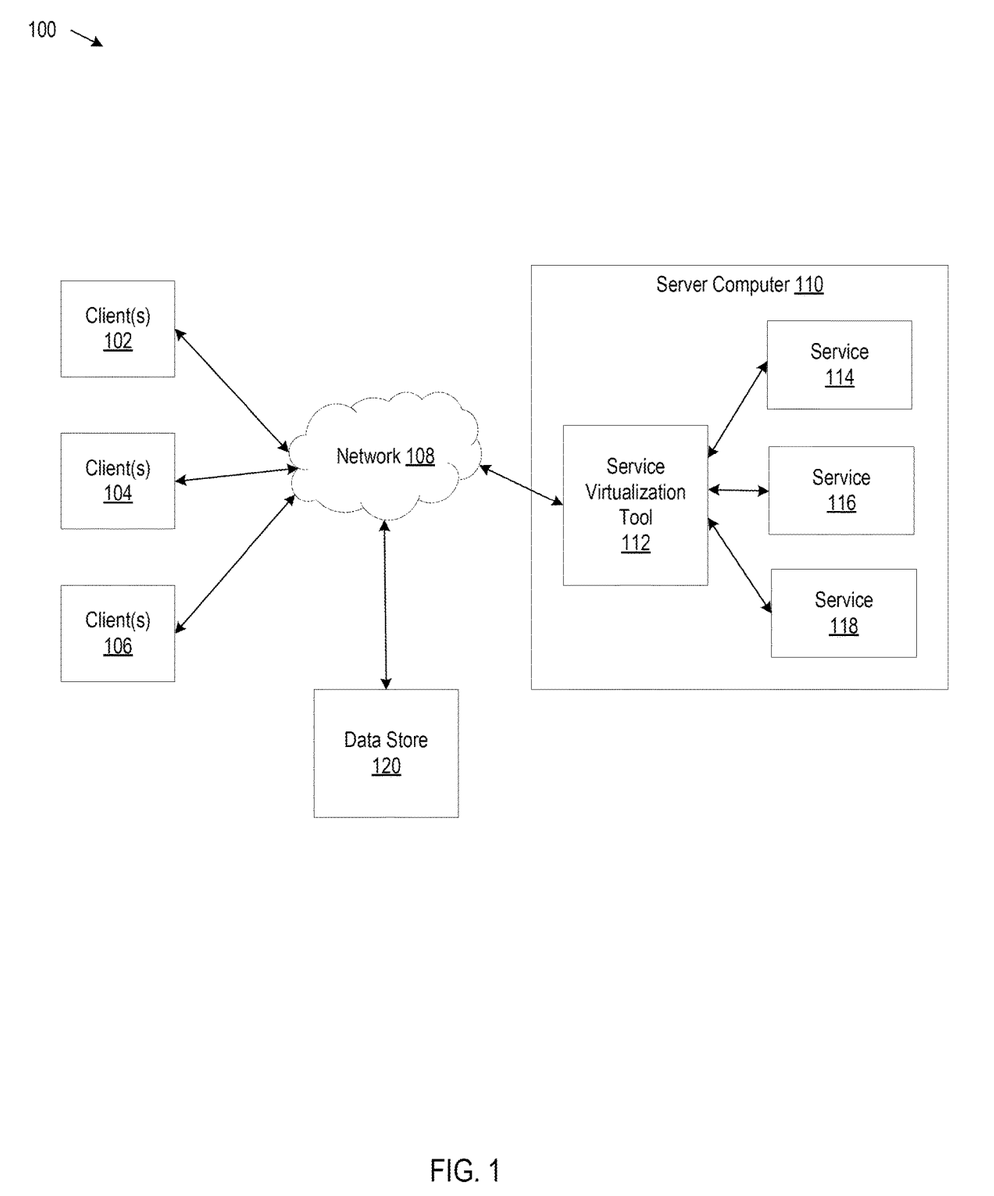
FIG. 1 illustrates an example system that supports the end-to-end testing of a client application.

FIG. 1 illustrates an example system 100 that enables end-to-end testing of computer implemented application using a service virtualization solution. System 100 includes one or more clients 102, 104, 106, a network 108, and a server computer 110 with a service virtualization tool 112, one or more services 114, 116, 118 and one or more data stores 120.

In some examples, each of the one or more clients 102, 104, 106 can be a computing device executing one or more software applications that access one or more services made available by server computer 110 through a communication protocol over the network 108. In this example, one or more of the client devices 102, 104, 106 may send requests to the one or more services 114, 116, 118 on server computer 110 for data and functionality associated with one or more applications.

For instance, one or more of client devices 102, 104, 106 can send a request to the one or more services 114,116, 118 on server computer 110 to access data and functionality associated with online banking. However, the one or more client devices 102, 104, 106 can access the one or more of the services 114,116, 118 for many different types of data and functionality. In some examples, the communication protocol used to make the request may be TCP/IP. However, other communication protocols are also possible. Although three clients 102, 104, 106 and three services 114, 116, 118 are shown, the system 100 allows for a higher or lower number of clients and services.

The example network 108 may be a computing device network that may include the Internet, private networks, and a combination thereof. In some arrangements, the network 108 includes wired and/or wireless networks. As noted, in this example, the client devices 102, 104, 106 can communicate with the one or more services 114, 116, 118 using the network 108.

The example the server computer 110 can include the service virtualization tool 112 and one or more services 114, 116, 118. In some examples, the server computer 110 may be a server computer of a financial institution. In other examples, the server computer 110 may be a server computer associated with a different enterprise. Although a single server computer 110 is shown in the system 100, in reality, the server computer 110 can be implemented with multiple computing devices, such as a server farm or through cloud computing. Many other configurations are possible.

The example service virtualization tool 112 is implemented in example server computer 110. For example, the service virtualization tool 112 is configured to receive data packets from one or more of the clients 102, 104, 106 and forward it to the one or more of the services 114, 116, 118 and receive the data packets from the one or more services 114, 116, 118 and forward it to the one or more clients 102, 104, 106.

In some examples, the service virtualization tool 112 is implemented in the same server computer as the one or more services 114, 116, 118. In other examples, the service virtualization tool 112 can be implemented in a different server computer that is communicatively connected with the one or more services 114, 116, 118 through a network. In yet other examples, the service virtualization tool 112 can be implemented in the same computing device as one or more clients 102, 104, 106. The service virtualization tool 112 is described in further detail in relation to FIGS. 2-9.

The example services 114, 116, 118 can include computer implemented applications with functionality or set of functionalities that the one or more clients 102, 104, 106 can request and use for different purposes. Example functionalities associated with the one or more services 114, 116, 119 include retrieval of specified data from a data source or plurality of data sources, execution of one or more operations, etc.

In some examples, the one or more services 114, 116, 118 can be implemented on the same server computer 110. In other examples, one or more services may be implemented in a computing device or server computer that is communicatively connected to the clients 102, 104, 106 through the service virtualization tool 112. Other methods of implementing the services 114, 116, 118 is also possible.

The example data store 120 may include one or more electronic databases that can store session data associated with the service virtualization tool 112. In some examples, session data includes data associated with a recorded scenario. For example, a scenario may include the transmission of a packet of data from one of the clients 102, 104, 106 to one of the services 114, 116, 118. Session data associated with the scenario includes the direction of data flow (client to server), length of message bytes, time since last message, actual message bytes, date and time of transmission, etc. One non-limiting example of a data format for such session data is illustrated below.

| Direction | Length | Last message | Message Time | Data (unencrypted) |
|---|---|---|---|---|
| To service | 100 bytes | 13:00 GMT | 13:01 GMT | [data - unencrypted] |

The data store 120 may be maintained by the same enterprise that maintains the server computer 110 or the data store 120 may be maintained by an external third party enterprise. The data store 120 can be accessed by the service virtualization tool 112 to store and retrieve relevant session data.

Figure 2:
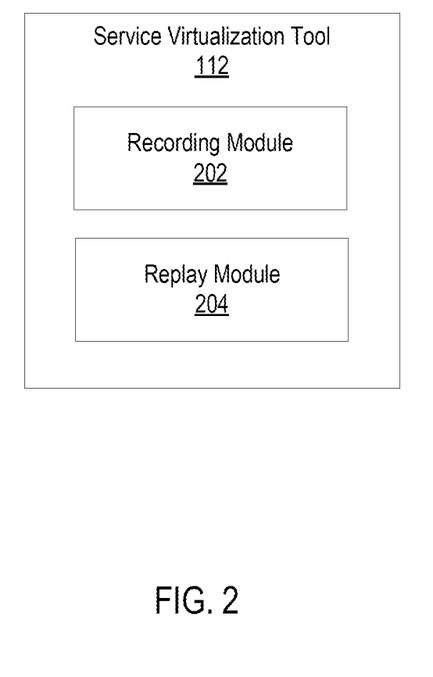
FIG. 2 illustrates an example configuration of the service virtualization tool of a server computer of the system of FIG. 1.

FIG. 2 illustrates an example configuration of the service virtualization tool 112. In some examples, the service virtualization tool 112 operates in two stages—a recording stage and a replay stage to simulate a backend service.

In some examples, the recording module 202 is configured to execute the operations of the recording stage of the service virtualization tool 112. The recording stage is configured to operate during a test creation process. For example, during the recording stage, the configurations of the client devices 102, 104, 106 are modified to redirect the flow of data from the client device 102, 104, 106 to the service virtualization tool 112 instead of to the services 114, 116, 118. In other examples, the configurations of the client device 102, 104, 106 may not be modified to redirect the flow of data, but rather the data packets can be intercepted by the service virtualization tool 112. Other implementations are also possible.

For example, modifying the configurations to redirect data to the service virtualization tool 112 can include modifying the target location pathway from the intended service's location to the location of the service virtualization tool 112. In some examples, the service virtualization tool 112 exposes an interface to the client that is similar to the interface of the service that the data was intended for. The service virtualization tool 112 itself is configured to forward the received data to the proper service 114, 116, 118.

For example, the modifications of the client's configurations allow for the recording module 202 of the service virtualization tool 112 to receive data packets from the client device 102, 104, 106, record the data and information associated with the data as a flat file and then forward the data packets to the service 114, 116, 118. The operation of the recording module 202 is described in further detail in relation to FIG. 3.

In some examples, the replay module 204 is configured to execute the operations of the replay stage of the service virtualization tool 112. The replay stage is configured to operate during a test execution process based on the data recorded during the test creation process. For example, during the replay stage, the replay module 204 of the service virtualization tool 112 creates a proxy to which the client device 102, 104, 106 connects. In turn, the replay module 204 uses the recorded session data files to simulate the response from the service 114, 116, 118 by reading the recorded session data file. The operation of the replay module 204 is described in further detail in relation to FIG. 4.

Figure 3:
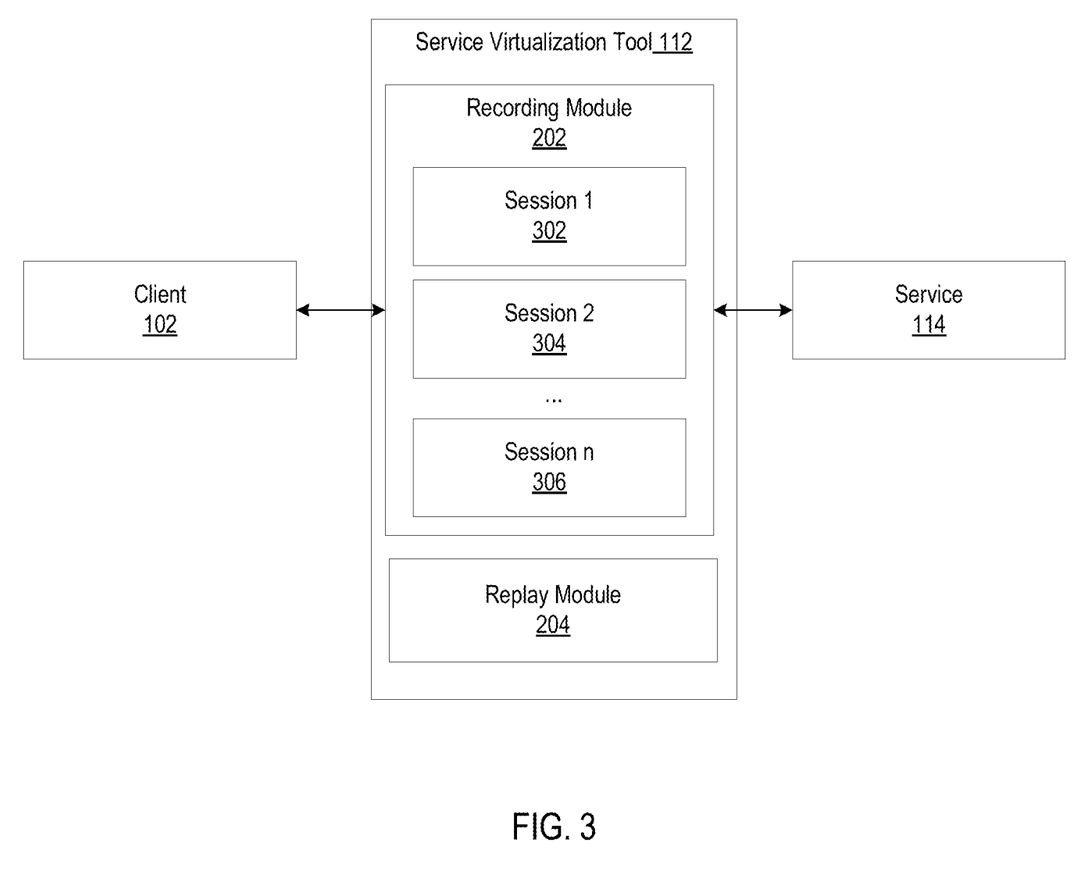
FIG. 3 illustrates an example configuration of the service virtualization tool of FIG. 2.

FIG. 3 illustrates an example configuration of the flow of data during the recording stage of the service virtualization tool 112. In the disclosed example, the client device 102 is connected to the service virtualization tool 112, which in turn is connected to the service 114 and the service virtualization tool 112 is configured to create a session file 302, 304, 306 for each scenario.

For example, during the recording stage, the configurations of the client device 102 are modified to redirect the data to the service virtualization tool 112 rather than targeting the specific service 114. In some examples, the service virtualization tool 112 receives the data packets that are sent from the client device 102 and records the data and information associated with the data before forwarding the data packets to the service 114. In other examples, the service virtualization tool 112 also receives the data packets that are sent from the service 114 and records the data and information associated with the data before forwarding the data packets to the client device 102.

In some examples, a scenario includes a request made by the client device 102 to the service 114. Example scenarios include an order to purchase stock, trader taking an action, execution of an order, etc. For example, a request from the client device 102 to the service 114 is typically in the form of a data stream. The data stream includes one or more packets of data. In some examples, the data stream may include binary serialized data. In other examples, the data stream may include other formats of data. For example, the data stream can be transmitted by the client by a communication protocol, such as TCP/IP. Other example communication protocols that can be used in the transmission of data include HTTP, REST, any MQ protocols and Oracle Coherence In-Memory Object store. Other protocols are also possible.

In some examples, the data packets associated with each scenario are captured and recorded in one of the session files 302, 304, 306 along with supplemental information associated with the data itself. Multiple sessions can be run for the same scenario and the data from each session is captured in a separate session file. In other examples, multiple scenarios may be captured within one session file or data from one scenario can be captured in multiple session files. Other implementations of storing the scenario data area also possible.

For example, for each scenario, the service virtualization tool 112 can captures a packet of data transmitted by the client/service and information associated with the captured packet of data and stores the captured data packet and associated information in one of the session files as a flat file. In some examples, the associated information can include direction of data flow (client to service or service to client), length of the message (length of the data in the data packet), time since last message (time since last data packet was received by the service virtualization tool), time of day (date and time when the data packet was received), and message (the raw data byte steam in the data packet) itself. One non-limiting example of a data format for such a capture is illustrated below.

| Direction | Length | Last message | Message Time | Data (unencrypted) |
|---|---|---|---|---|
| To service | 100 bytes | 13:00 GMT | 13:01 GMT | [data - unencrypted] |

The time since last message is recorded in order to keep track of the order in which the data packets were received. The service virtualization tool 112 does not decrypt or otherwise analyze the captured data. Instead, the order in which the data received is used as the marker during the replay stage. Therefore, the disclosed service virtualization tool is agnostic to the communication protocol or data format.

In some examples, the session files 302, 304, 306 may be stored in a data store, such as data store 120 using a database file structure. In other examples, the files are agnostic to the storage method and can be stored using any data structure.

Figure 4:
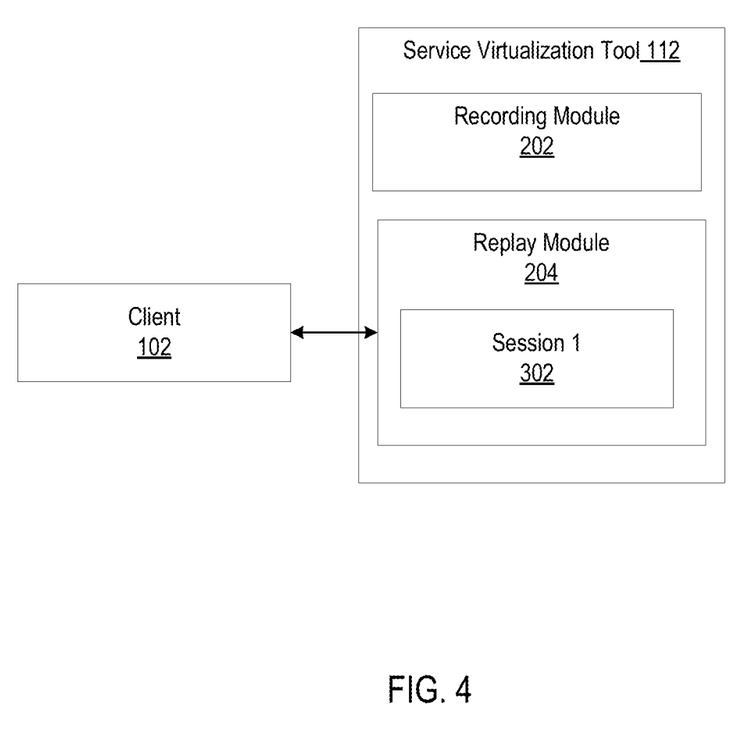
FIG. 4 illustrates another example configuration of the service virtualization tool of FIG. 2.

FIG. 4 illustrates an example configuration of the flow of data during the replay stage of the service virtualization tool 112. The example configuration of FIG. 4 includes the client device 102, and the service virtualization tool 112 acting as a proxy service that uses the data recorded during the recording stage in session file 1 302 to mimic the operation of the service 114 from FIG. 3.

The disclosed service virtualization tool 112 does not match responses to requests based on the content of the request itself. Therefore, the content and context of the data packets associated with the request need not be analyzed at all. Rather, the disclosed service virtualization tool uses the time stamps and the order of the data packets received and transmitted to simply transmit a response based on the what is next in the recorded order of data packets. In other words, the service virtualization tool 112 does not wait for the client device 102 to request for data back. Rather the service virtualization tool 112 may replay the data events as it was recorded.

In one example, during the recording stage, the service virtualization tool 112 may have received a first request or first data packet from the client device 102 to the service 114 at time T1. In response, the service 114 may have transmitted a response, second data packet to the client device 102 at T2, followed by another response, a third data packet, at time T3. In this example, if the time difference between T1 and T2 was 1 second, and the time difference between T2 and T3 was 2 seconds during the recording stage, then during the replay stage, the service virtualization tool 112 that is mimicking the actions of the service 114 simply sends a copy of the second data packet (from a saved session file) to the client 1 second after receiving the first data packet and sends a copy of the third data packet (from another saved session file) to the client 2 seconds after sending the second data packet. Thus, the service virtualization tool 112 does not need to analyze a request or match a request with a certain response to mimic the functioning of a service 114. Rather, the time stamps are used to simply replay the activities of the service 114 as previously recorded in the same order of time.

In another example scenario, during the recording stage, the service virtualization tool 112 may have received a first request or a first data packet where the client device 102 sends a request or a first data packet to the service 114 at time T1 and 1 second later receives a response or a second data packet from the service 114, followed by some user input at the client device 102 that results in a second request or a third data packet from the client device 102 to the service 114 at time T3 and a response or fourth data packet from the service 114 to the client 2 seconds later at time T4.

In such an example situation outline above, during the replay stage, the replay of the fourth data packet by the service virtualization tool 112 is necessarily impacted by when the third data packet is received. In other words, service virtualization tool 112 cannot replay the transmission of the fourth data packet until the third data packet is received. The disclosed service virtualization tool 112 can account for this situation by including a marker within the session files. For example, during the record mode, a marker may be added to the session files to denote that a client input is necessary in order to proceed to the next scenario. The marker itself may be added by a user using a user interface associated with the service virtualization tool 112. A user may include a developer, an analyst, or any other user managing the test scenario. In some examples, the user may add the markers manually. In other examples, the user may use an independent application to automatically add the markers. Examples of the service virtualization tool 112 user interfaces are included in association with FIGS. 5-9.

For example, during replay stage, the service virtualization tool 112 may determine whether the session file includes a marker. If so, the corresponding data stored within the particular session file is not transmitted to the client until a data packet is to be received from the client. In other words, when the service virtualization tool 112 encounters a session file during replay that includes a marker, the service virtualization tool 112 pauses the execution of the replay process and waits for a request from the client.

In one example, upon receiving a request from the client, the service virtualization tool 112 continues replay of the session files in the order it was recorded. In another example, the service virtualization tool 112 may continue the replay of the session files upon being un-paused manually. In yet another example, the service virtualization tool 112 may be integrated to an automation test suite that can be programmed to include scripts that automatically pause and up-pause the replay of the service virtualization tool 112 by interfacing with the client application and causing the client to complete the action expected by the server virtualization tool 112 or by interfacing with the server virtualization tool 112 itself and causing the tool 112 to un-pause.

FIGS. 5-9 illustrate example graphical user interfaces of the disclosed service virtualization tool 112. Although in some implementations a graphical user interface is used to manage and execute the disclosed service virtualization tool 112, in other implementations, the end-to-end testing configured by the disclosed service virtualization tool 112 can be managed and executed through a command line, service or any other interface.

Figure 5:
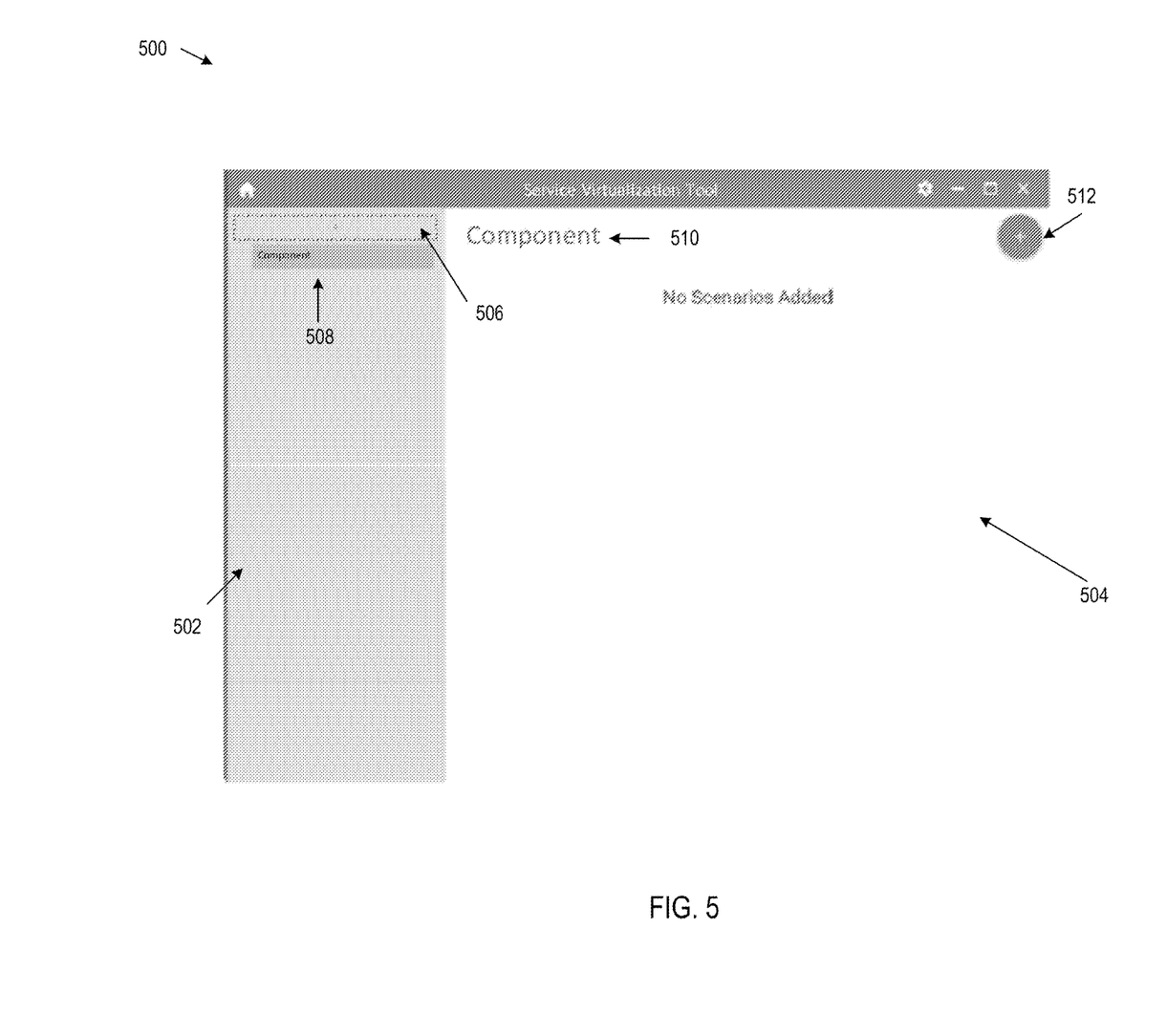
FIG. 5 illustrates an example user interface of the service virtualization tool from the system of FIG. 1.

FIG. 5 illustrates an example graphical user interface 500 of the service virtualization tool 112. In some examples, the user interface 500 includes a menu panel 502 and a detailed view panel 504. The menu panel 502 may include one or more options related to the creation and management of components and scenarios within the service virtualization tool 112. The detailed view panel 504 includes details associated with the option selected within the menu panel 502. For example, if the user selected a displayed scenario from the menu panel, the detailed view may include a descriptions of the scenario, a list of sessions associated with the selected scenario, options to manage each of the sessions, and other data associated with the selected scenario.

In some examples, the menu panel 502 may include an "add component" button 506. Each component added using the "add component" button 506 may be configured to represent one of the services 114, 116, 118 that the service virtualization tool 112 is configured to mimic. In the examples from FIG. 5, the "add component button 506 is represented by a plus button. However, other forms of selectable controls can be used to represent the "add component" button 506.

In the example user interface 500 shown in FIG. 5, an empty component named "component" has already been added and is represented by the component menu option 508 on the menu panel 502. Selecting the component menu option 508 on the menu panel 502 causes the detailed view panel 504 to be populated with further information regarding the selected component menu option 508, such as the component name, a list of scenarios associated with the component, options to manage each of the scenarios and other data associated with the component. In the example user interface 500, the component name 510 is displayed on the top of the detailed view panel 504. However, in the example from FIG. 5, since the added component was an empty component that did not contain any scenarios, no other information is displayed on the detailed view panel 504 other than a message indicating, "No Scenarios Added."

In some examples, the detailed view panel 504 also includes an create new scenario option 512 that allows the user to add scenarios to the selected component. In the disclosed example from FIG. 5, the create new scenario option 512 is a selectable plus button. In other examples, the create new scenario option 512, other ways of implementing the selectable option are also possible. Selecting the create new scenario option 512 allows the user to create a new scenario that is associated with the selected component. Other methods of configuring the user interface 500 are also possible.

Figure 6:
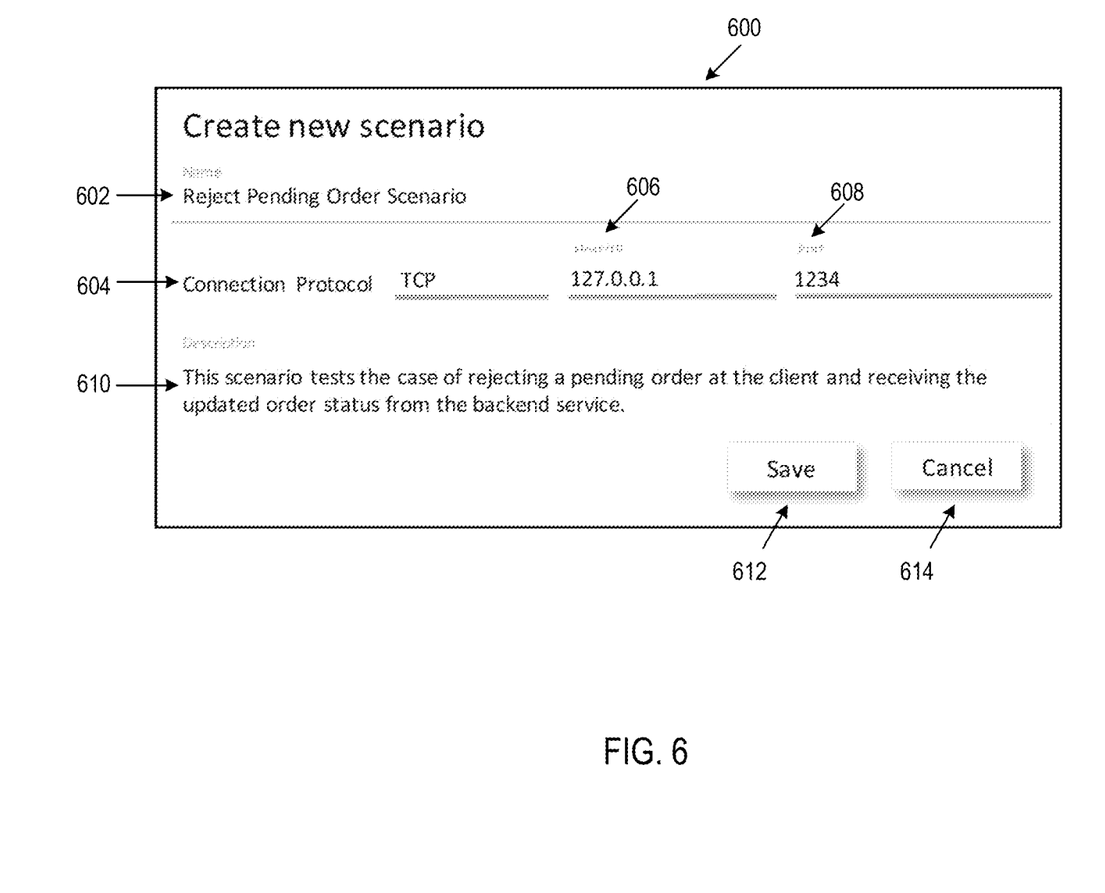
FIG. 6 illustrates another example user interface of the service virtualization tool from the system of FIG. 1, displaying the interface for creating a new scenario.

FIG. 6 illustrates another example user interface of the service virtualization tool 112. FIG. 6 illustrates a "create new scenario" user interface 600 that opens when the create new scenario option 512 is selected on the user interface 500. In some examples, upon selection of the create new scenario option 512, the "create new scenario" user interface 600 may open as a new window. In other examples, the "create new scenario" user interface 600 may be embedded within the user interface 500 itself.

The "create new scenario" user interface 600 includes an option to enter the name of the scenario 602. In the example from FIG. 6, the name of the new scenario being created is "reject pending order scenario." In one example, the "reject pending order scenario" may include a scenario where a client application rejects an order to purchase of 100 shares of IBM stock and the order management service application responds with an updated order status regarding the order, such as an order status of "order canceled." In another example, the "reject pending order scenario" can include a different scenario altogether.

The "create new scenario" user interface 600 includes an option 604 to enter the type of connection protocol. The connection protocol option 604 may allow the user to enter the type of connection protocol or select from a list of connection protocols that are configured to work with the server virtualization tool 112. In the example from FIG. 6, the selected connection protocol option 604 is TCP protocol. Other types of connection protocols that may be configured to work with the server virtualization tool 112 includes HTTP, MQ protocols, REST, and Oracle Coherence In-Memory Object store. Other protocols are also possible.

In some examples the "create new scenario" user interface 600 also includes an option to enter the host/IP 606. The host/IP 606 allows the user to enter the IP address of the service 114, 116, 118 that the client device 102, 104, 106 intends to connect to. In the example from FIG. 6, the host/IP 606 is entered as: 127.0.0.1.

In some other examples, the "create new scenario" user interface 600 also includes an option to provide a port number 608. A port number is a logical construct that identifies a specific process or type of network service. A port number is associate with an IP address of a host and the type of protocol used for communication. In the example from FIG. 6, the port number is entered as 1234.

In some examples, the "create new scenario" user interface 600 includes an option 610 to enter a brief description of the created new scenario. The description option 610 may include a brief text description of the scenario that is being created to make it easier for users to understand the function of the scenario. In this case, the description option 610 is entered as "This scenario tests the case of rejecting a pending order at the client and receiving the updated order status from the backend service."

Figure 7:
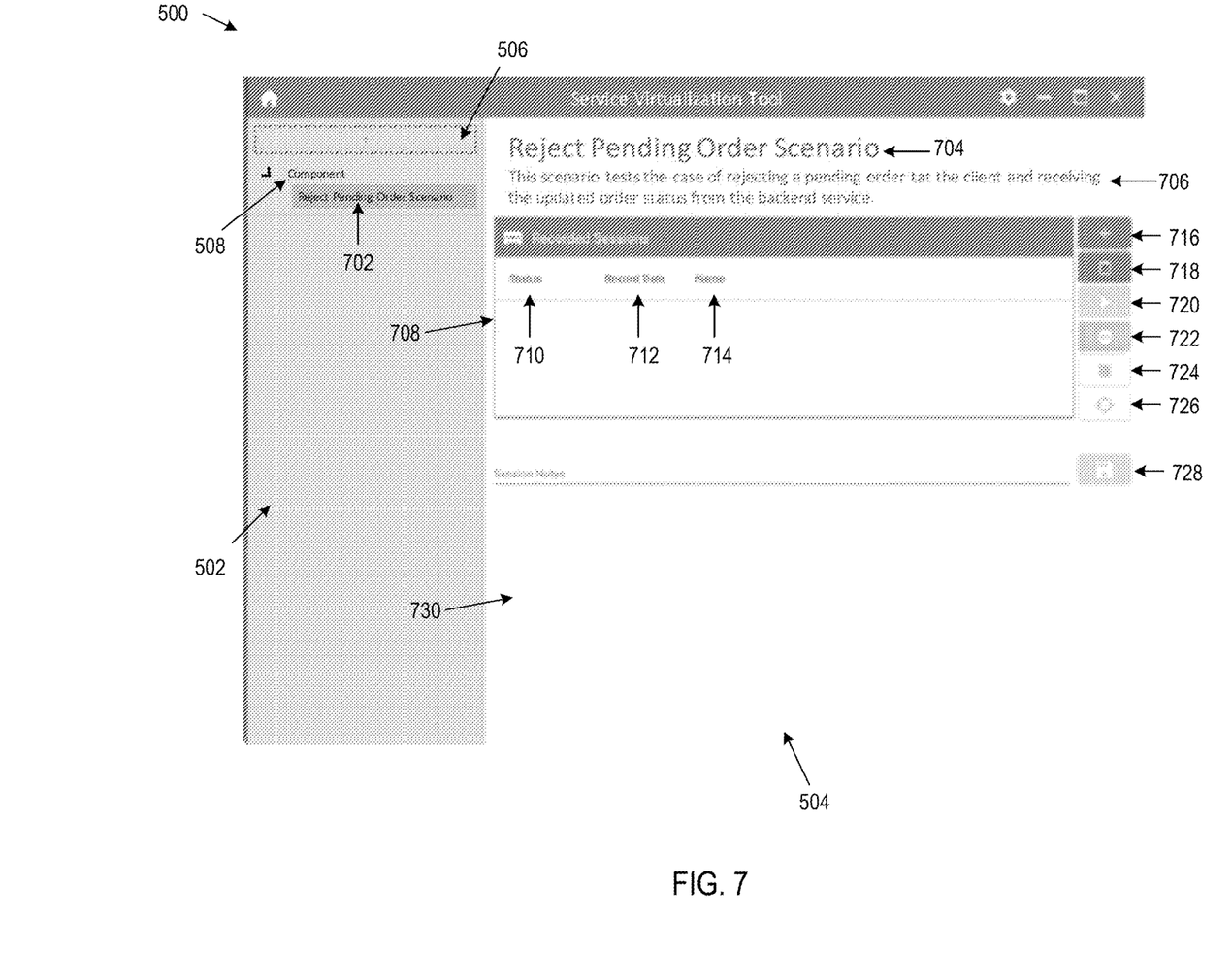
FIG. 7 illustrates another example user interface of the service virtualization tool from the system of FIG. 1.

In some examples, the "create new scenario" user interface 600 includes an option to save the created scenario 612 and an option to cancel the creation of the new scenario 614. In some examples, when the save option 612 is selected, the created scenario, with the entered options 602-610 can be saved and the window with user interface 600 can close automatically. The saved scenario is then populated on the user interface 500 and included as a sub-option under the component 508 within the menu panel 502 as illustrated in FIG. 7. In other examples, when the cancel option 614 is selected, the options entered on the "create new scenario" user interface 600 are not saved and the window closes. Other implementations of the "create new scenario" user interface 600 are also possible.

FIG. 7 illustrates yet another example of the user interface 500 of the service virtualization tool 112. For example, FIG. 7 illustrates an example user interface 500 that has been updated to add a new "reject pending order" scenario as described in relation to FIG. 6.

In some examples, upon the addition of a new scenario to the existing component, "component," the menu panel 502 includes a scenario sub-option 702 that is listed below the previously listed component menu option 508 and identified using the scenario name. In the example from FIG. 7, the scenario sub-option 702 is identified using the scenario name "reject pending order scenario." In other examples, the hierarchical listing of the component menu option 508 and the scenario sub-option 702 may be organized and displayed differently.

In some examples, when the user selects the scenario sub-option 702, the detailed view panel 504 is populated with details regarding the selected scenario, in this case, the "reject pending order scenario." In some examples, the detailed view panel 504 displays the name of the selected scenario 704 and a description of the selected scenario 706 at the top of the panel 504.

The detailed view panel 504 may further include a sessions sub-panel 708 within the detailed view panel 504 that lists the sessions associated with the selected scenario. In some examples, the sessions sub panel 708 includes a list of all sessions associated with the selected scenario. In the example from FIG. 7, the session sub-panel 708 is empty as no sessions have been added yet. As described in relation to FIGS. 8 and 9, the session sub-panel 708 is populated once a new session is added.

In some examples, the session information is organized based on status of session 710, record date of the session 712 and name of the session 714. For example, the status of the session 710 can indicate whether the selected session is being recorded, played, stopped, copied, etc. The record date of the session 712 can indicate the date the session was recorded. The name of the session 714 may indicate the name the user provided to identify the session by. In other examples, other ways of organizing the session data is possible.

In some examples, the session sub-panel 708 also includes several selectable session options 716-728 for managing the sessions listed within the session sub-panel 708. The session options 716-728 may only be available for use as available in relation to the selected session. In the example from FIG. 7, several session options are grayed out or otherwise disabled because no sessions currently exist in the example session sub-panel 708 from FIG. 7. In the example from FIG. 7, only session options 716 and 718 are available for use. As session are added to the session sub-panel 708, other options may become available for selection as appropriate.

In some examples, the add new session option 716 allows the user to add a new session that is associated with the selected scenario, the "reject pending order scenario" in the case of the example illustrated in FIG. 7. The add new session option 716 is further described in relation to FIG. 8.

In some examples, the copy session option 718 can be used to copy a selected session from the session sub-panel 708 of the selected scenario 702 and pasted into a different scenario if desired. Another way of copying a session includes right-click on a session within the session sub-panel 708. In some examples, right-clicking on a session may bring up several options including an option to copy, paste, delete, etc. Other options are also possible.

Figure 10:
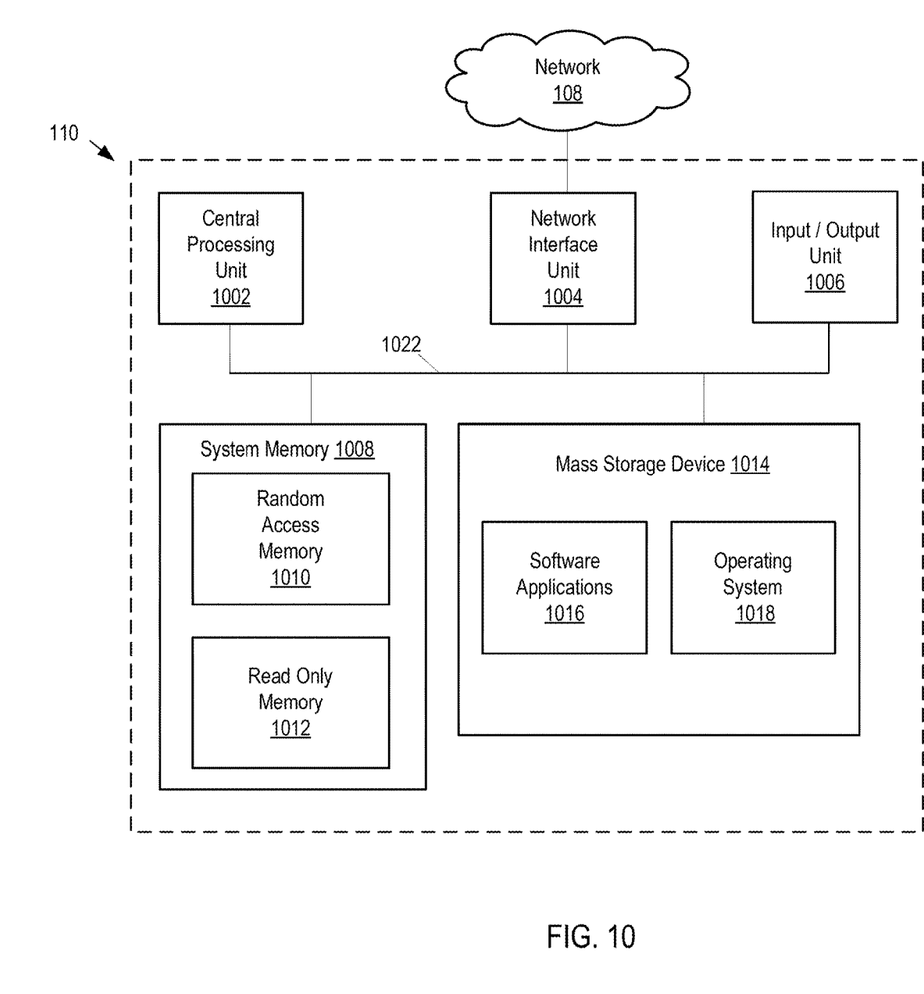
FIG. 10 illustrates example physical components of the server computer of the system of FIG. 1.

In some examples, the play session option 720, record session option 722, stop recording option 724 and add marker option 726 are used in association with the record stage and replay stage as described in detail in relation to FIG. 10. In other examples, the example save session option 728 allows the user to save the added session in association with the selected scenario.

In some examples, the detailed view panel 504 may further include a session notes option 730. The session notes option 730 may include a text field where the user may add notes regarding the selected session. Other configurations of the user interface 500 are also possible.

Figure 8:
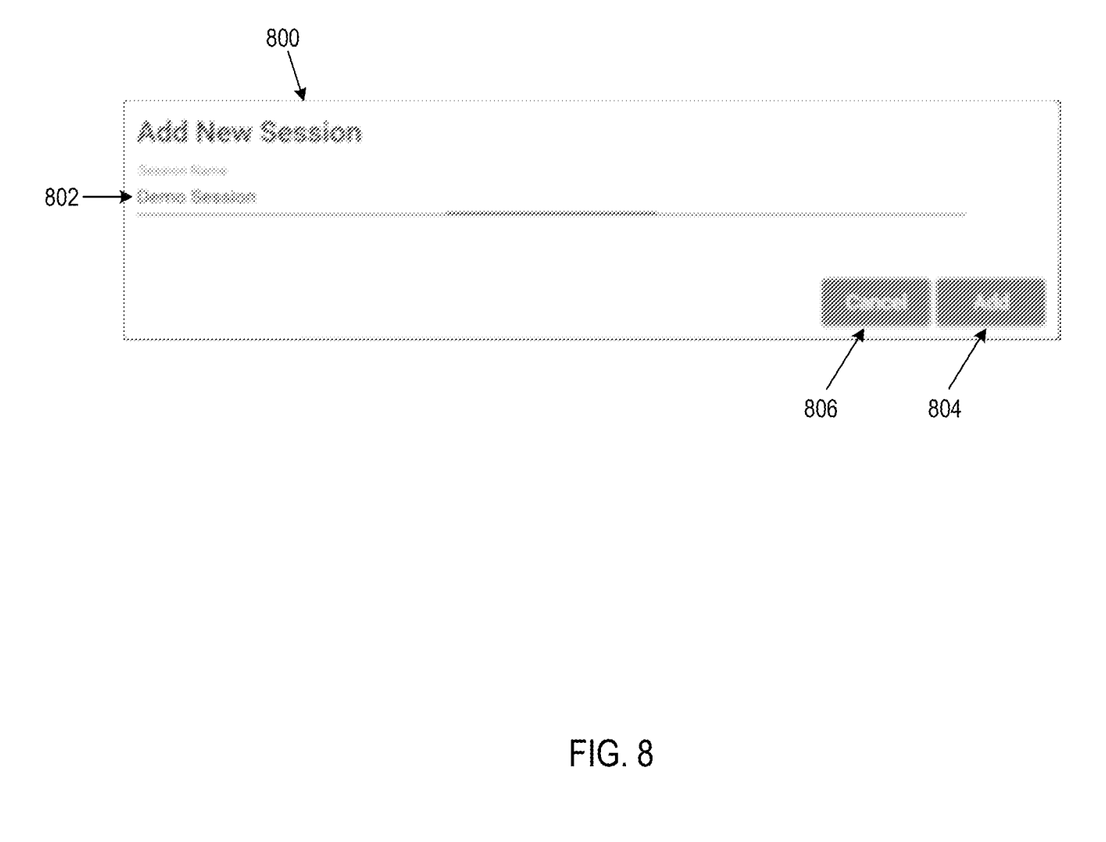
FIG. 8 illustrates another example user interface of the service virtualization tool from the system of FIG. 1.

FIG. 8 illustrates another example user interface of the service virtualization tool 112. FIG. 8 illustrates a "add new session" user interface 800 that opens when the add new session option 716 is selected on the user interface 500. In some examples, upon selection of the add new session option 716, the "add new session" user interface 800 may open as a new window. In other examples, the "add new session" user interface 800 may be embedded within the user interface 500 itself.

In some examples, the "add new session" user interface 800 includes an option 802 for the user to add a session name. In some examples, the add session name option 802 includes a text field for the user to include a text denoting the file name. In the exampled from FIG. 8, the session name of the new session is "demo session."

In some examples, the "add new session" user interface 800 includes an option to add the newly created session 804 and an option to cancel the newly created session 806 from being added. In some examples, when the add option 804 is selected, a new session with a session name as indicated on the add session name option 802 is added to the selected scenario sub-panel 708 from FIG. 7. In other examples, when the cancel option 806 is selected, "add new session" user interface 800 is closed without any new session being added to the sessions sub-panel 708 from FIG. 7. Other options of configuring a "add new session" user interface 800 are also possible.

Figure 9:
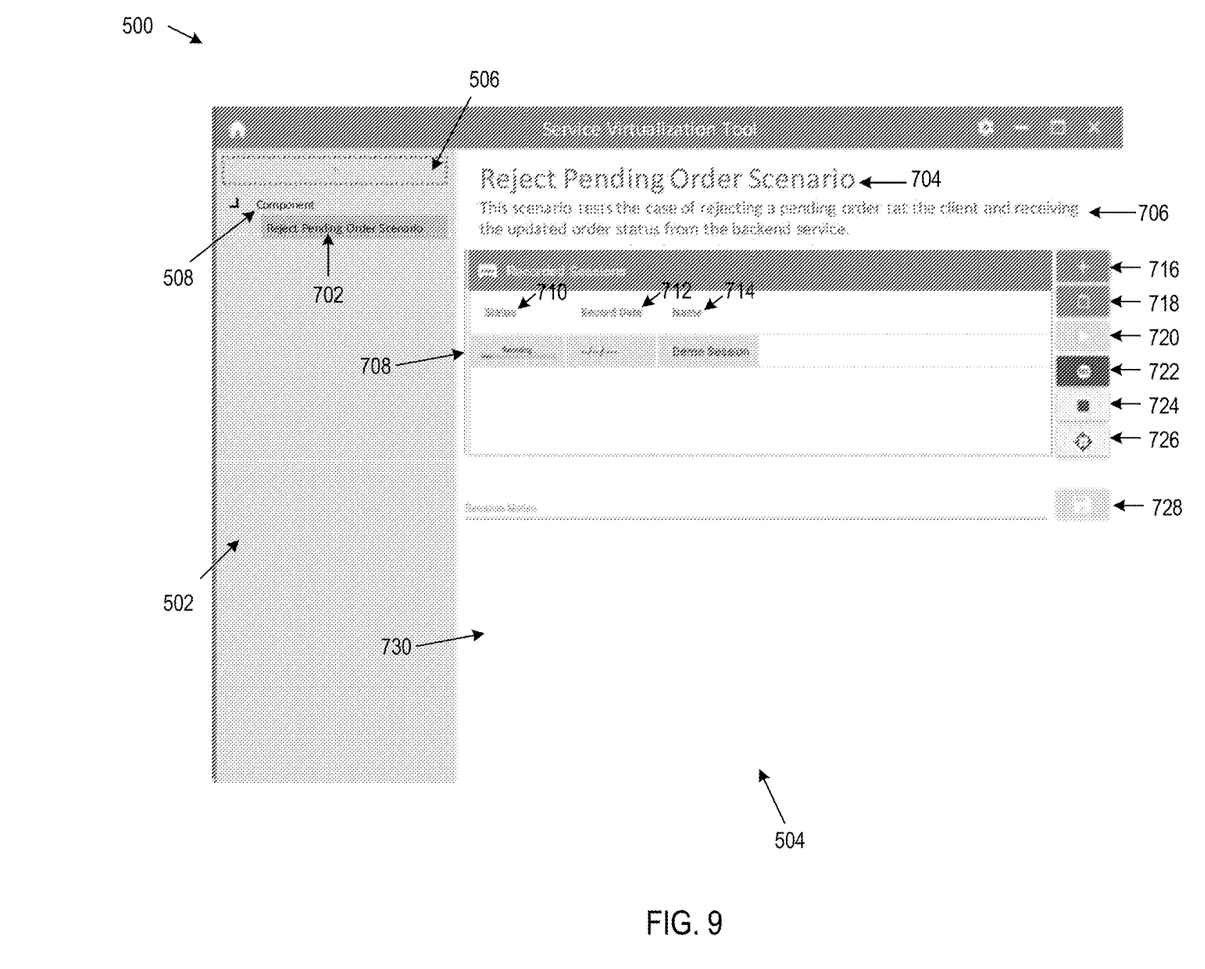
FIG. 9 illustrates another example user interface of the service virtualization tool from the system of FIG. 1.

FIG. 9 illustrates yet another example of the user interface 500 of the service virtualization tool 112. For example, FIG. 9 illustrates an example user interface 500 where a new session is being recorded.

In the example from FIG. 9, the session sub-module 708 includes the newly added session, named "Demo Session," that was described in relation to FIG. 8. For example, the status of the session 710 shows a progress bar with the words "recording" to indicate that the session in the process of being recorded.

For example, during a test creation process, described in the further detail in relation to FIGS. 2-4, the record session option 722 can be selected in order to begin the record stage of the service virtualization tool 112. When the session is being recorded, all data that is being transmitted and received between the client device 102, 104, 106 and the service 114, 116, 118 may be recorded. In some examples, the recording process may be temporarily paused by selecting the play session option 720, which toggles between an option to pause or play the recording based on the status of the recording.

In some examples, the recording of the session can be stopped, when the user selects the stop recording option 724. After the recording is stopped, the session can be finalized when the user selects the save session option 728. At this point the session is saved and the test creation process is completed.

During the recording process, specific client actions can be performed using a client marker option 726. In some examples, the client marker adds a special data-stamp in the recorded data to denote the session to pause at that point during playback so that the user or an automation tool can interact with the client application before playback continues. Other options to add markers is also possible.

During the testing process itself, the user may play the recorded session by selecting the session and selecting the play session option 720. Upon selection of the play session option 720, the service virtualization tool 112 may enter a replay stage as described in further detail in relation to FIGS. 2-4. Once a recording of a session is completed, the session can be played back any number of times using the play session option 720, which is enabled once the session has recording data and the option 720 is selected.

Although all session options 716-726 are described as being controlled manually, a user may develop an automated script to automatically record/replay or even add markers to the session files as needed. Other ways of implementing the record/replay operations of the service virtualization tool 112 are also possible.

As illustrated in the example of FIG. 10, server computer 110 includes at least one central processing unit ("CPU") 1002, a system memory 1008, and a system bus 1022 that couples the system memory 1008 to the CPU 1002. The system memory 1008 includes a random-access memory ("RAM") 1010 and a read-only memory ("ROM") 1012. A basic input/output system that contains the basic routines that help to transfer information between elements within the server computer 110, such as during startup, is stored in the ROM 1012. The server computer 110 further includes a mass storage device 1014. The mass storage device 1014 is able to store software instructions and data, including software applications 1016 and an operating system 1018. Some or all of the components of the computer 110 can also be included in client devices 102, 104, 106.

The mass storage device 1014 is connected to the CPU 1002 through a mass storage controller (not shown) connected to the system bus 1022. The mass storage device 1014 and its associated computer-readable data storage media provide non-volatile, non-transitory storage for the server computer 110. Although the description of computer-readable data storage media contained herein refers to a mass storage device, such as a hard disk or solid state disk, it should be appreciated by those skilled in the art that computer-readable data storage media can be any available non-transitory, physical device or article of manufacture from which the central processing unit can read data and/or instructions.

Computer-readable data storage media include volatile and non-volatile, removable and non-removable media implemented in any method or technology for storage of information such as computer-readable software instructions, data structures, program modules or other data. Example types of computer-readable data storage media include, but are not limited to, RAM, ROM, EPROM, EEPROM, flash memory or other solid state memory technology, CD-ROMs, digital versatile discs ("DVDs"), other optical storage media, magnetic cassettes, magnetic tape, magnetic disk storage or other magnetic storage devices, or any other medium which can be used to store the desired information and which can be accessed by the server computer 110.

According to various embodiments of the invention, the server computer 110 may operate in a networked environment using logical connections to remote network devices through the network 108, such as a wireless network, the Internet, or another type of network. The server computer 110 may connect to the network 108 through a network interface unit 1004 connected to the system bus 1022. It should be appreciated that the network interface unit 1004 may also be utilized to connect to other types of networks and remote computing systems. The server computer 110 also includes an input/output controller 1006 for receiving and processing input from a number of other devices, including a touch user interface screen, or another type of input device. Similarly, the input/output controller 1006 may provide output to a touch user interface screen or other type of output device.

As mentioned briefly above, the mass storage device 1014 and the RAM 1010 of the server computer 110 can store software instructions and data. The software instructions include one or more software applications 1016. The software instructions can also include an operating system 1018 suitable for controlling the operation of the server computer 110. The mass storage device 1014 and/or the RAM 1010 also store software instructions, that when executed by the CPU 1002, cause the server computer 110 to provide the functionality of the server computer 110 discussed in this document. For example, the mass storage device 1014 and/or the RAM 1010 can store software instructions that, when executed by the CPU 1002, cause the server computer 110 to display received data on the display screen of the server computer 110.

Although various embodiments are described herein, those of ordinary skill in the art will understand that many modifications may be made thereto within the scope of the present disclosure. Accordingly, it is not intended that the scope of the disclosure in any way be limited by the examples provided.

What is claimed is:

1. A method for conducting a testing scenario, the method comprising:
    during a recording phase of the testing scenario:
        intercepting data transmissions between a client application and a service application, wherein each of the data transmissions includes one or more data packets;
        recording the one or more data packets associated with each of the data transmissions and time interval data associated with each of the one or more data packets as a recording, wherein the time interval data defines an amount of time between each subsequent data packet in the data transmissions; and
        adding one or more markers to the recording to indicate that timing of a subsequent data transmission from the client application is variable; and
    during a replaying phase of the testing scenario:
        creating a proxy service to simulate the service application;
        facilitating the data transmissions to continue between the client application and the proxy service, wherein the proxy service mimics the service application by transmitting the one or more data packets associated with the data transmissions as recorded at time intervals that match the time interval data; and
        upon encountering each of the one or more markers on the recording, pausing replaying of the data transmission until the subsequent data transmission is received from the client application.

2. The method of claim 1, further comprising: allowing each of the data transmissions to continue when the service application is unavailable.

3. The method of claim 1, further comprising:
    storing origin data associated with each of the one or more data packets, the origin data defining whether each of the one or more data packets originated from the client application or from the service application.

4. The method of claim 3, further comprising: mimicking the service application by selecting the data transmissions based upon the origin data associated with each of the one or more data packets.

5. The method of claim 1, further comprising: one or more scripts that automatically pause and un-pause the replaying of the data transmissions.

6. The method of claim 1, wherein the data transmissions between the client application and the service application use a Transmission Control Protocol (TCP) protocol.

7. The method of claim 1, wherein the data transmissions are a serialized stream of bytes.

8. The method of claim 1, wherein at least one of the client application and the service application is associated with a financial institution.

9. The method of claim 1, further comprising: record the one or more data packets associated with each of the data transmissions without decrypting the one or more data packets.

10. A system for conducting a testing scenario, the system comprising:
- a processing unit; and
- system memory, the system memory including instructions which, when executed by the processing unit, cause the system to:
  during a recording phase of the testing scenario:
  - intercept data transmissions between a client application and a service application, wherein each of the data transmissions includes one or more data packets; and
  - record the one or more data packets associated with each of the data transmissions and time interval data associated with each of the one or more data packets as a recording, wherein the time interval data defines an amount of time between each subsequent data packet in the data transmissions;
  - add one more markers to the recording to indicate that timing of a subsequent data transmission from the client application is variable; and
  during a replaying phase of the testing scenario:
  - create a proxy service to simulate the service application;
  - facilitate the data transmissions to continue between the client application and the proxy service, wherein the proxy service mimics the service application by transmitting the one or more data packets associated with the data transmissions as recorded at time intervals that match the time interval data, and
  - upon encountering each of the one or more markers on the recording, pause the replaying of the data transmission until the subsequent data transmission is received from the client application.

11. The system of claim 10, wherein the instructions, when executed by the processing unit, further cause the system to allow each of the data transmissions to continue when the service application is unavailable.

12. The system of claim 10, wherein the instructions, when executed by the processing unit, further cause the system to:
- store origin data associated with each of the one or more data packets, the origin data defining whether each of the one or more data packets originated from the client application or from the service application.

13. The system of claim 12, wherein the instructions, when executed by the processing unit, further cause the system to mimic the service application by selecting the data transmissions based upon the origin data associated with each of the one or more data packets.

14. The system of claim 10, wherein an application is used to automatically add the one or more markers.

15. The system of claim 10, wherein the data transmissions between the client application and the service application use a Transmission Control Protocol (TCP) protocol.

16. The system of claim 10, wherein the data transmissions are a serialized stream of bytes.

* * * * *

UNITED STATES PATENT AND TRADEMARK OFFICE
CERTIFICATE OF CORRECTION

| | | |
|---|---|---|
| PATENT NO. | : 11,907,104 B1 | Page 1 of 1 |
| APPLICATION NO. | : 17/804418 | |
| DATED | : February 20, 2024 | |
| INVENTOR(S) | : Saraf Uddin Talukder et al. | |

It is certified that error appears in the above-identified patent and that said Letters Patent is hereby corrected as shown below:

In the Claims

Column 15, Line 27, Claim 10: delete "one more" and insert --one or more--

Signed and Sealed this
Twenty-third Day of April, 2024

Katherine Kelly Vidal
*Director of the United States Patent and Trademark Office*